United States Patent [19]
Powell et al.

[11] Patent Number: 5,953,272
[45] Date of Patent: Sep. 14, 1999

[54] DATA INVERT JUMP INSTRUCTION TEST FOR BUILT-IN SELF-TEST

[75] Inventors: Theo J. Powell, Dallas, Tex.; Kuong Hua Hii, Sinapore, Singapore; Danny R. Cline, Plano, Tex.

[73] Assignee: Texas Instruments Incorporated, Dallas, Tex.

[21] Appl. No.: 09/004,994

[22] Filed: Jan. 9, 1998

Related U.S. Application Data

[63] Continuation-in-part of application No. 08/846,922, Apr. 30, 1997.

[51] Int. Cl.⁶ .................................................... G11C 7/00
[52] U.S. Cl. ...................................... 365/201; 365/189.02
[58] Field of Search ........................... 365/201, 189.02; 371/22.1, 22.2, 22.3, 22.4, 22.5, 27; 395/183.06

[56] References Cited

U.S. PATENT DOCUMENTS

| | | | |
|---|---|---|---|
| 5,258,986 | 11/1993 | Zerbe | 371/21.2 |
| 5,506,959 | 4/1996 | Cockburn | 395/183.18 |
| 5,668,815 | 9/1997 | Gittinger et al. | 371/21.2 |
| 5,675,545 | 10/1997 | Madhavan et al. | 365/201 |
| 5,844,914 | 12/1998 | Kim et al. | 371/22.1 |

*Primary Examiner*—David Nelms
*Assistant Examiner*—Anh Phung
*Attorney, Agent, or Firm*—Robby T. Holland; Carlton H. Hoel; Richard L. Donaldson

[57] ABSTRACT

A data invert jump instruction test for a built-in self-test of a memory device is provided. The data invert system comprises a read only memory (72) operable to store a plurality of test algorithms wherein at least one of the test algorithms includes a data invert jump instruction (160). Also included is a data invert circuit (178) coupled to the read only memory (72) and a toggle register (188) within the data invert circuit (178). The toggle register (188) is set to one when the data invert jump instruction (160) occurs for the first time in the test algorithm. This causes the data invert circuit (178) to output the inverse of the data inputted through the data invert circuit (178).

10 Claims, 3 Drawing Sheets

FIG. 3

| READ | WRITE | X | Y |  | TEST1 | TEST2 | TSET0 | TSET1 | DATA | ED | CKBD | ALT |  |
|------|-------|---|---|--|-------|-------|-------|-------|------|----|----|-----|--|
|      |       |   |   |  |       |       | D5    | D4    | D3   | D2 | D1 | D0  |  |
| 1    | 0     | 1 | 1 |  | 0     | 0     | 0     | 1     | 0    | 0  | 0  | 0   | ← ARRAY ACCESS 140 |
|      |       |   |   |  |       |       |       |       |      |    |    | 0   | ← PROGRAM CONTROL 142 |

FIG. 4

| READ | WRITE | X | Y |  | TEST1 | TEST2 | TSET0 | TSET1 | DATA | ED | CKBD | ALT |
|------|-------|---|---|--|-------|-------|-------|-------|------|----|----|-----|
|      |       |   |   |  |       |       | D5    | D4    | D3   | D2 | D1 | D0  |
| 0    | 0     | 0 | 0 |  | 0     | 1     | 0     | 0     | [ROM ADDRESS] |  |  |  |
| 0    | 0     | 0 | 0 |  | 0     | 0     |       |       |      |    |    |     |

- 180 — DATA FROM ROM FOR DATA GENERATOR
- 181 — DATA FROM ROM FOR PASS/FAIL COMPARE
- 182, 184, 186 — TO DATA GENERATOR 202
- 188 — TOGGLE
- 190 — RESET
- 192 — CLK
- 194, 196, 198, 200 — TO PASS/FAIL GENERATOR 204
- DATA INVERT JUMP
- RESET
- CLOCK

5,953,272

DATA INVERT JUMP INSTRUCTION TEST FOR BUILT-IN SELF-TEST

RELATED APPLICATIONS

This application is a continuation-in-part application of pending U.S. patent application Ser. No. 08/846,922, filed Apr. 30, 1997, assignee to the same party.

TECHNICAL FIELD OF THE INVENTION

This invention relates to the field of built in self tests for memory systems and more specifically to a data invert jump instruction test for built in self-test.

BACKGROUND OF THE INVENTION

In conventional testing of memory device, an external tester supplies control signals such as column address (CAS), row address (RAS), write enable (WE), address signals, and data to the device under test. Outputs from the device under test are sampled by the tester to determine whether the device passes or fails. As memory device density increases, testing time also increases. This increased testing time increases the manufacturing cost of integrated circuit memory devices.

In order to decrease the time it takes to test high density memory devices, parallel read and write schemes have been implemented. One drawback of implemented parallel read and write schemes is that an external tester is required. Also, parallel leads required to test the memory devices in parallel occasionally fail due to cross talk among the leads.

To avoid the drawbacks of parallel read and write schemes, built-in self-test arrangements have been used. The built-in self-test arrangement includes a read only memory that stores test algorithm instructions. The read only memory eliminates the need for external testers as well as parallel leads. Many different tests can be run in a built-in self-test arrangement. Since storage space for a built-in self-test arrangement is limited, it is desirable to write test algorithms as compact as possible. Many test require a pattern to be written to a memory array followed by the inverse of that pattern. However, current schemes lack the ability to efficiently repeat a test with the data inverted. Therefore, it is desirable to repeat a self-test with different data.

SUMMARY OF THE INVENTION

Accordingly, it may be appreciated that a need has arisen for a data invert jump instruction test for a built-in self-test of a memory device. In accordance with the present invention, a test enable control for a built-in self-test of a memory device is provided which substantially eliminates or reduces disadvantages and problems associated with current self-test schemes.

In one embodiment of the present invention, a data invert system for a built-in self-test of a memory device is provided. The data invert system comprises a read only memory operable to store a plurality of test algorithms wherein at least one of the test algorithms includes a data invert jump instruction. Also included is a data invert circuit coupled to the read only memory and a toggle register coupled to the data invert circuit. The toggle register is set to one when the data invert jump instruction occurs for the first time in the test algorithm. This causes the data invert circuit to output an inverse of the data inputted into the data invert circuit in order to repeat the test algorithm with the inverse of the data.

The present invention provides various technical advantages over current self-test schemes. For example, one technical advantage is the ability to allow a test to be run using the inverse of the data previously written or read using minimal amount of read only memory space. Another technical advantage is that a circuit is provided which alternately passes data and passes inverted data. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, in which:

FIG. 3 illustrates the types of instructions for test algorithms;

FIG. 4 illustrates a data invert jump instruction;

FIG. 5 illustrates a data invert logic circuit; and

DETAILED DESCRIPTION OF THE INVENTION

Figure 1:
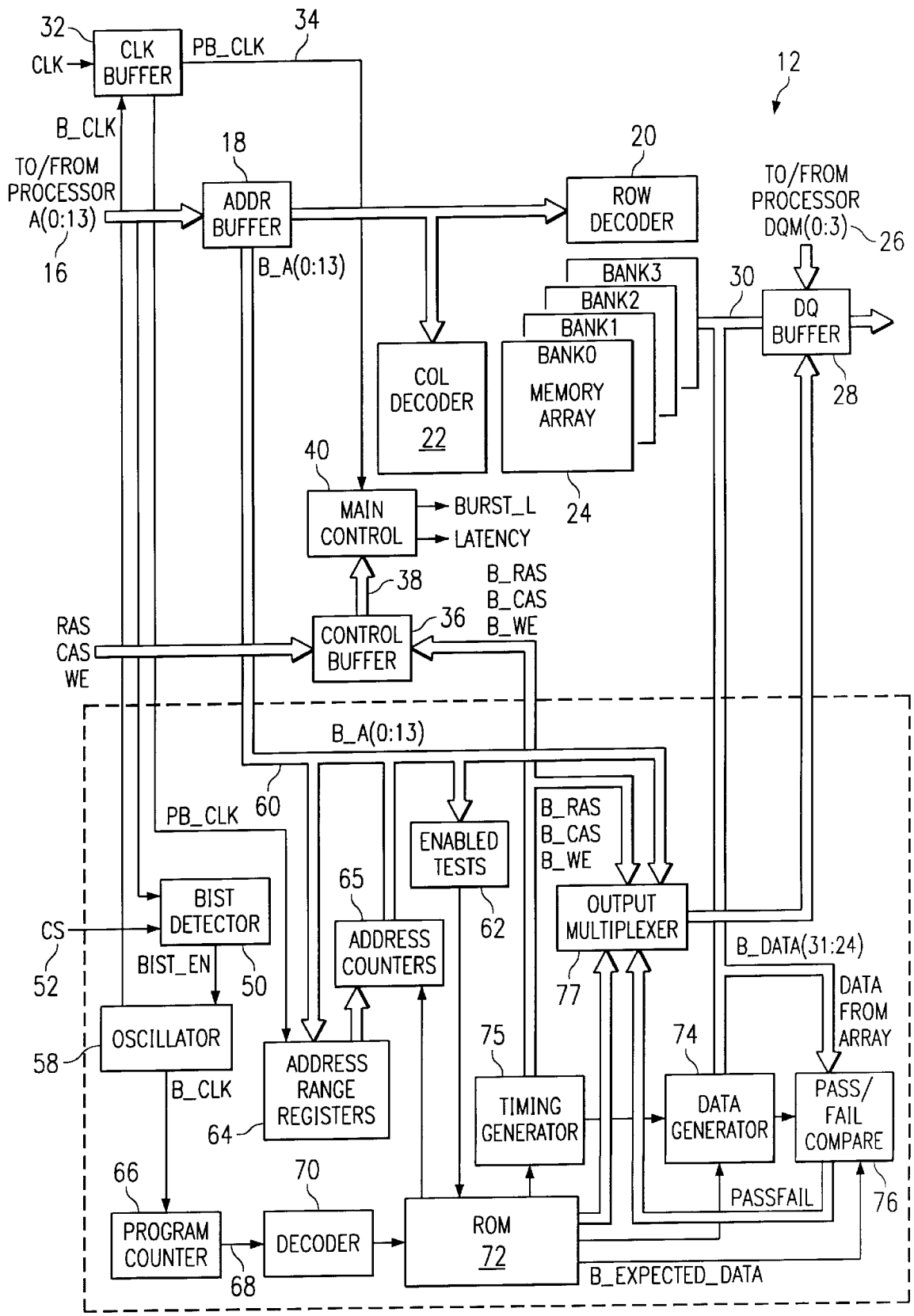
FIG. 1 illustrates a synchronous dynamic random access memory (SDRAM) with a built-in self-test device.

FIG. 1 illustrates a synchronous dynamic random access memory (SDRAM) 10 with built-in self-test device 10 in accordance with the teachings of the present invention. SDRAM 10 comprises a conventional memory 12 and a built-in self-test arrangement 14.

Conventional memory 12, in one embodiment, operates as a conventional synchronous dynamic random access memory during normal operation. In test operations, built-in self-test arrangement 14 operates in a self-test mode. All test signals are generated internally to SDRAM 10.

In normal mode, conventional memory 12 operates like a well-known synchronous dynamic random access memory device. A digital processor, such as a microprocessor (not shown) produces row and column address. The row and column addresses are provided on an address bus 16 in a time division multiplexed format for storage in an address buffer 18. After receiving a control signal from the digital processor, the row address and column address are decoded either by row decoder 20 or column decoder 22.

Depending upon the state of the write enable signal, WE, from the digital processor, data is either written into or read out from storage cells located in the banks of a memory array 24. Data which is written into memory array 24 is entered by way of data bus 26. In-coming data is buffered in a data buffer 28 and forwarded to memory array 24 by an internal data bus 30 where it is stored until it is written over or not properly refreshed. Data stored in memory array 24 can be addressed and read out of memory array 24 via internal data bus 30 and data buffer 28 to data bus 26. Typically, data bus 26 is connected to the data receiving and sending terminals of a digital processor such as a microprocessor.

Conventional memory 12, in one embodiment, is a synchronous dynamic random access memory and therefore relies on a system clock for synchronizing its operation with the digital processor, peripheral devices, and control circuitry connected to SDRAM 10. A clock signal CLK is applied to a clock buffer 32 which outputs an internal clock signal 34 for operating memory array 24 during normal operation.

The digital processor applies control signals CAS, RAS, and WE to a control signal buffer 36. During normal operation, these control signals pass through control buffer 36, over to a control bus 38 to a main control unit 40 or for access to memory array 24 through row decoder 20 and column decoder 22. During normal operations, internal system clock signal 34 and the control signals control operation of memory array 24.

The self-test mode is entered if special signal conditions are applied at power up of SDRAM 10. Typically, to initiate the self-test mode, a DC signal will be applied externally to SDRAM 10. In one example, an overvoltage signal to a specific address pin (such as pin A4) of SDRAM 10 would place SDRAM 10 in a self-test condition. Once an overvoltage is applied to a specific pin, a built-in self-test detector circuit 50 responds to this overvoltage by placing built-in self-test arrangement 14 into the self-test mode.

In the self-test mode, built-in self-test arrangement 14 prepares for testing by gathering information on what test to run. The self-test mode is exited when another input is applied to an address lead. In one embodiment, that input applies a high level to control signal 52 (CS) at built-in self-test detector circuit 50. In this embodiment, the self-test mode will be active as long as control signal 52 remains at a high level state. Once control signal 52 falls to a low level state, the self-test mode is exited. Further description of the arrangement and operation of built-in self-test detector 50 can be found in copending U.S. application Ser. No. 08/840,428 (TI-22640), hereby incorporated by reference herein.

Upon entering the self-test mode, built-in self-test detector 50 sends a BIST_EN signal to an oscillator 58. In response to the BIST_EN signal, oscillator 58 generates a clock signal B_CLK that is applied to a clock buffer 32 in order to take control of clock buffer 32. Alternatively, an external clock scheme may be used. The internal/external clock option is discussed in copending U.S. application Ser. No. 08/004,998 (TI-23099), which is hereby incorporated by reference herein.

When in the self-test mode, data from address buffer 18 is transferred via internal address bus 60 to an enabled test circuit 62. Enabled test circuit 62 is a shift register that stores data identifying a specific test, or group of tests, to be run during the self-test mode. Once the selected test data is stored in enabled test circuit 62, a group of addresses may be stored in an address range register 64. Address data can then be tracked using address counter 65. Further details of enable test circuit 62 can be found in copending U.S. application Ser. No. 09/005,081 (TI-23013) which is hereby incorporated by reference herein.

Also included is a program counter 66 operable to control test sequences. Upon initiation of self-test mode, program counter 66 is reset to its zero state by clock signal B_CLK. Program counter 66 is a sequential logic arrangement in which the next state of program counter 66 is determined by a current state of program counter 66 and the state of data furnished by a Read-only-Memory (ROM) register.

A Read only Memory decoder 70 receives binary signals from program counter 66 via a bus 68. The binary signals are decoded by ROM address decoder 70. In one embodiment, a one out of sixty-four code technique is used to select a row of data from a read only memory 72. In one embodiment, ROM 72 is a sixty-four row read only memory that stores sequences of instruction for controlling routines. In one embodiment, ten test algorithms are stored in ROM 72. Each row address applied form ROM address decoder 70 to ROM 72 accesses a row of data stored therein in response to clock signal B_CLK. One row of data typically makes up one instruction of an algorithm. It is in one of these instructions that a mask release number for SDRAM 10 is stored.

Instructions are outputted from ROM 72 to a data generator 74 which generates the data to be written to or read from memory array 24. A pass/fail circuit 76 compares the data from memory array 24 with the expected data from ROM 72 and data generator 74. When expected data is equivalent to the data from memory array 24, a pass signal is generated. If not, a fail signal is generated. Fail signals are stored in a register (not pictured) and conveyed through data buffer 28 where the results can be read off a pin of SDRAM 10.

Additionally, instructions from ROM 72 are received by timing generator 75 which generates self-test signals such as B_RAS, B_CAS and B_WE, which are the internally generated equivalent of RAS, CAS, and WE. B_CAS, B_RAS and B_WE instructions pass to control signal buffer 36 when in self-test mode. Output multiplexer 77 takes data involving DRAM addresses, control signals, clock information, and data from pass/fail circuit 76 and presents it to DQ buffer 28.

Figure 2:
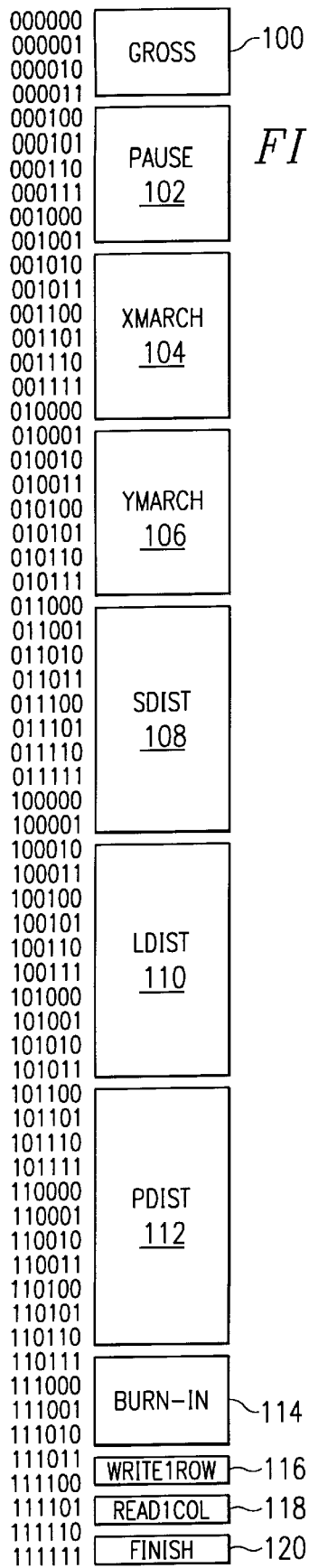
FIG. 2 illustrates read only memory addresses and the corresponding self-tests.

FIG. 2 illustrates read only memory 72 addresses and the corresponding self-tests. In the illustrated embodiment, a total of ten self-tests are provided. In this embodiment, a gross test 100 occupies ROM 72 address 000000 to 000011. Gross test 100 is a write and read test from a full array. A pause test 102 occupies address 000100 to 001000. Pause test 102 tests for data retention. An Xmarch test 104 occupies address 001010 to 010000. Xmarch test 104 writes to one column at a time until the entire memory array 24 is filed. A Ymarch test 106 occupies address 010001 to 010111. Ymarch test 106 writes to one row at a time until the entire memory array 24 is filed. A short disturb test 108 occupies address 011000 to 100001. Short disturb test 108 tests adjacent rows using a disturb algorithm having short cycle timing. Further details of short disturb test can be found in copending U.S. application Ser. No. 09/004,991 (TI-19734) which is hereby incorporated by reference herein. A long disturb 110 occupies address 100010 to 101011. Long disturb test 110 tests adjacent rows using a disturb algorithm having long cycle timing. A page disturb test 112 occupies address 101100 to 110110. Page disturb test 112 tests adjacent rows in a page mode. A burn in test 114 occupies addresses 110111 to 111010. Burn in test 114 does a full array burn in. Further details of burn in test 114 can be found in copending U.S. application Ser. No. 09/004,973 (TI-23823) which is hereby incorporated by reference herein. A write one row test 116 occupies address 111011 to 111100. This test writes to one row. A read one column test 118 occupies address 111101 to 111110. Read one column test 118 reads data from one column. Finally, address 111111 is the end of the self-tests and contains an idle instruction 120 as well as the mask release number for SDRAM device.

FIG. 3 illustrates the types of instructions for the various self-tests. Two major types of instructions exist. The first of the instruction types are program control instructions 142 and the second of the instruction types are array access instructions 140. Program control instructions 142 control the operation of the built-in self-test while array access instructions 140 determine how cells of memory array 24 are to be accessed and written to and/or read from. In one embodiment, both are twelve bit instructions. In array access instructions 140, Read is a command to read a cell, Write is a command to write to a cell, X determines if columns are to be accessed, Y determines if rows are to be accessed, Tset 0 and Tset 1 set the timing of the self-test, Dat determines what data is to be used, ED is the expected data, Ckbd sets the pattern to be read or written, and Alt determines if the address is to be incremented or decremented. For example, if an array access instruction 140 of 101100010000 is given, that would correspond to read X and Y using a specific time set with an expected data of 0.

For program control instructions 142, the first six bits list an instruction and the last six bits are a ROM 72 address. The first four bits of the first six bits are typically 0, and the next two determine the program control type, while the last six bits determine the ROM 72 address to jump to if the first six bits require a jump. The very last instruction in ROM 72 is idle instruction 120 which signals the end of the built-in self-test. For example, idle instruction 120 is 010011 for the first six bits. When this instruction is reached, the built-in self-test is over and the program control sits at an idle state until built-in self-test is exited and normal mode resumes. Since an idle instruction logically does not require a jump, the last 6 bits are unused. Thus, the last six bits of idle instruction 120 may be used in any manner such as for storing the mask release number for SDRAM 10. Further details of storing mask release numbers can be found in copending U.S. application Ser. No. 09/005,359 (TI-23015) which is hereby incorporated by reference herein.

FIG. 4 illustrates a data invert jump instruction. Data invert jump instruction 160 comprises a first six bits 162 containing the data invert instruction and a second six bits 164 containing a jump address. In one embodiment, first six bits 162 are 000001. Data invert instruction 160 is used to test whether a set of instructions has been invoked an odd number of times or an even number of times. The first time data invert jump instruction is reached, control jumps to the address in the second six bits 164. Additionally, all instructions are interpreted as inverted. For example, if a write zero is called for, a one will be written instead when the data invert jump instruction 160 is reached, a second time data is not inverted and no jump occurs.

FIG. 5 illustrates a data invert logic circuit 178. Data invert logic circuit 178 may be implemented as part of ROM 72 or as a separate unit. Data from ROM 72 for data generator 74 passes to a multiplexer 186. Multiplexer 186 has a noninverted input 182 and an inverted input 184. Multiplexer 186 also has a toggle input 198. Toggle input 198 is supplied via toggle register 188. Initially, toggle register 188 is set to zero at power up or at the beginning of a new algorithm by reset line 190. When data invert jump instruction 160 is read, toggle register 188 is set to one. When toggle register 188 is zero, toggle input 198 is zero and noninverted input 182 is outputted to data generator 74. When toggle register 188 is one, toggle input 198 is one and inverted input 184 is selected. The normal path for the data 180 from the ROM to the Data Generator and the data 181 from the ROM for Pass Fail compare is noninverted. When the Data invert jump instruction 160 is read, the toggle register 188 is set to a one, both the data generator input 180 and the pass fail compare input 181 are inverted.

Similarly, data from ROM 72 destined for pass/fail block 76 passes to a multiplexer 200. Multiplexer 200 has a noninverted input 194 and an inverted input 196. Multiplexer 200 also has a toggle input 198. When toggle input 198 is zero, noninverted input 194 is outputted, and if toggle input 198 is one, inverted input 196 is outputted.

Toggle register 188 is set to one the first time data invert jump instruction 160 is read in a particular algorithm. The second time data invert jump instruction 160 is read in a given algorithm, toggle register 188 is reset to zero. Data is not inverted and the overall algorithm scheme (test) continues through the remaining enabled self-test. When toggle register 188 is zero, program control 66 jumps to the address associated with data invert jump instruction 160. If toggle register 188 is one, program counter 66 increments by one (i.e., the next instruction in line is executed).

Figure 6:
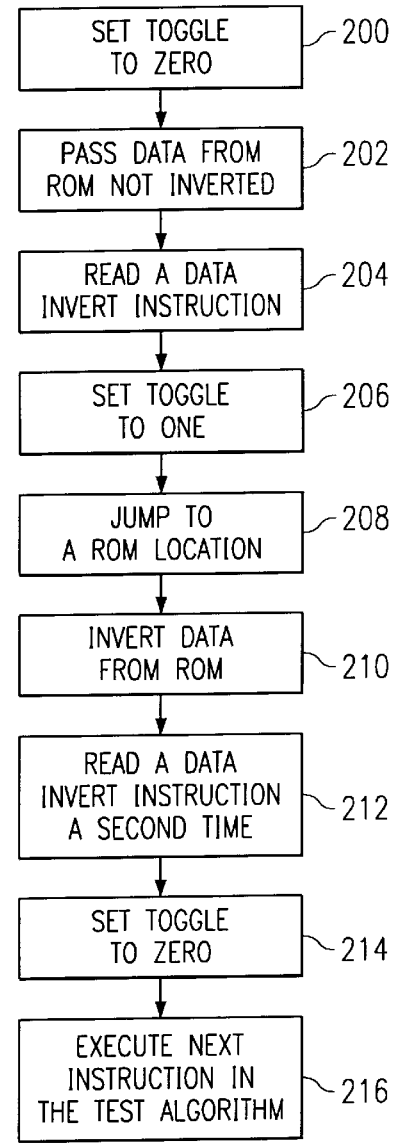
FIG. 6 is a flowchart of the operation of the data invert jump instruction.

FIG. 6 is a flowchart of the operation of data invert jump instruction 160 for a particular self-test. In step 200, toggle register 188 is set initially to zero. Data from ROM 72 passes non-inverted to data generator 74 and pass/fail block 76 in step 202. In step 204, a data invert jump instruction 160 is read for the first time for that particular test algorithm. After this occurs, toggle register 188 is set to one in step 206 and program counter 66 jumps to a read only memory location with ROM indicated 121 data invert jump instruction 160 in step 208. Typically, the read only memory location provided by the data invert jump instruction is associated with the beginning of the particular self-test performed with non-inverted data. In step 210, data from ROM 72 is inverted before reaching data generator 74 and pass/fail block 76.

In step 212, data invert jump instruction 160 is read a second time in the same test algorithm. The toggle register 188 is set to zero in step 214 and the next instruction in the test algorithm is executed in step 216. Thus, the particular self-test was performed with non-inverted data and inverted data in a sequential fashion.

One example of a test algorithm which utilizes a data invert instruction is the pause test. The pause test, in one embodiment, comprises five instructions. These five instructions are illustrated in table 1 below.

| Instruction number | Instruction |
| --- | --- |
| 1 | Pause:jnte xmarch |
| 2 | PS1:write all w0 ckbd tset1 |
| 3 | PS2:Pause |
| 4 | jtnc ps2 |
| 5 | read all r0 chkbd tset1 |
| 6 | dinvj ps1 |

In table one, the twelve bit sequence for instructions have been replaced by instruction mnemonics for simplicity. The first instruction, jnte xmarch, is the jump enable instruction. If the xmarch self-test is enabled, program counter 66 jumps to the beginning of the xmarch self-test in order to begin execution. If not, program counter 66 will jump to the address of the next self-test. Instruction two writes a checkerboard pattern to the entire array using a zero as the initial value and using a specific timing set. Instruction three and four causes the xmarch test to pause for a set time. Instruction five reads the entire array looking for a checkerboard pattern that begins with a zero (verifies line 2). Instruction six is the data invert jump instruction 160. Dinj is the mnemonic for data invert jump instruction 160 and ps1 is the address to where control will jump. Since this is the first time the data invert jump instruction 160 is reached, control will jump back to ps1 and all data will be interpreted as inverted. This means the second instruction will execute again, this time writing a checkerboard pattern to the entire array using a one as the initial data. Again, instructions three and four will require a pause for a set time. In instruction five, the writing is again verified, this time verifying that the checkerboard pattern starts with a one. Program flow returns to instruction six, the data invert jump instruction 160. Since the data invert jump instruction 160 is reached a second time, instead of executing a jump, program counter 66 jumps to the next self-test.

Thus, it is apparent that there has been provided, in accordance with the present invention, a data invert jump instruction test for a built in self-test of a memory device that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A data invert circuit comprising:
   a first multiplexer having an inverted input, a noninverted input and a toggle input, the first multiplexer located between a read only memory and a data generator;
   a second multiplexer having an inverted input, a noninverted input and a toggle input;
   the second multiplexer located between read only memory and a pass/fail block; and
   a toggle register coupling the toggle input;
   wherein the first multiplexer and the second multiplexer output the noninverted input when the toggle register is at a first value and wherein the first multiplexer and second multiplexer output the invert input when the toggle register is at a second value.

2. The circuit of claim 1, further comprising a read only memory coupled to first and second multiplexer, the read only memory operable to store a plurality of test algorithms.

3. The circuit of claim 2, wherein the toggle register changes in response to a data invert instruction in one of the plurality of test algorithm.

4. The circuit of claim 2, wherein the toggle register resets at the beginning of each one of the plurality of test algorithms.

5. A data invert system for a built-in self-test comprising:
   a read only memory operable to store a plurality of test algorithm, at least one of the test algorithms including a data invert jump instruction;
   a data invert circuit coupled to the read only memory; and
   a toggle register coupled to the data invert circuit;
   wherein the toggle register is set to one when the data invert jump instruction occurs for the first time in the test algorithm causing the data invert circuit to output the opposite of data inputted into the data invert circuit.

6. The system of claim 5, wherein the data invert jump instruction comprises a jump instruction and a read only memory address.

7. The system of claim 6, wherein one test algorithm of the plurality of test algorithm includes a data invert instruction and a jump to the read only memory address associated with the invert data jump instruction occurs the first time the invert data jump instruction is reached in the test algorithm.

8. The system of claim 5, wherein the data toggle register is reset when the data invert instruction occurs a second time.

9. A method for inverting data in a built-in self-test comprising the steps of:
   setting a toggle register to zero;
   outputting a noninverted input from a data invert circuit;
   setting the toggle register to one when a data invert instruction in a test algorithm is read;
   jumping to a read only memory address associated with the data invert instruction;
   outputting an inverted input from a data invert circuit;
   setting the toggle register to zero when a data invert instruction is read a second time; and
   executing the next instruction in the test algorithm.

10. The method of claim 9, wherein the data invert circuit receives data input from an instruction stored in a read only memory.

* * * * *